United States Patent [19]

Reche

[11] Patent Number: 5,030,318

[45] Date of Patent: Jul. 9, 1991

[54] METHOD OF MAKING ELECTRICAL PROBE DIAPHRAGMS

[75] Inventor: John J. Reche, Ventura, Calif.

[73] Assignee: Polycon Corporation, Tempe, Ariz.

[21] Appl. No.: 413,944

[22] Filed: Sep. 28, 1989

[51] Int. Cl.$^5$ .......................... B44C 1/22; C23F 1/02; C03C 15/00; C03C 25/06

[52] U.S. Cl. .................................. 156/630; 156/628; 156/633; 156/634; 156/644; 156/656; 156/657; 156/659.1; 156/663

[58] Field of Search ............... 156/626, 627, 628, 630, 156/633, 634, 644, 656, 657, 659.1, 663, 668; 437/8; 324/500, 537

[56] References Cited

U.S. PATENT DOCUMENTS 4,668,336  5/1987  Shimkunas ...................... 156/655 X
4,784,721 11/1988  Holmen et al. ...................... 156/647

Primary Examiner—William A. Powell
Attorney, Agent, or Firm—Blakely, Sokoloff, Taylor & Zafman

[57] ABSTRACT

Methods of making an electrical probe diaphragm wherein the diaphragm is integral with the surrounding support structure, which methods are conducive to the fabrication probing circuitry integral therewith. In accordance with the method, a substrate having first and second surfaces is coated on the first surface with an uncured polymer film in the polymer cured. Also, one or more pattern metalization layers are provided, typical over the polymer layer and extending peripherally outward to contact regions near the periphery of the substrate, preferably accessible from the second side of the substrate so contact with the pattern metalization layer or layers forming the probe circuitry may be made from the second side of the substrate. The central region of the substrate thereafter removed, typically by etching from the second side of the substrate so as to remove the support for the polymer layer and metalization layers in that region, leaving the same as a diaphragm substantially integral with the remaining peripheral region of the substrate. Details of the methods and alternates thereto are disclosed.

28 Claims, 1 Drawing Sheet

METHOD OF MAKING ELECTRICAL PROBE DIAPHRAGMS

BACKGROUND OF THE INVENTION

1. Field of the Invention

The present invention relates to test diaphragms for the electrical probing of integrated circuits and the like.

2. Prior Art

In certain situations it is desired to be able to directly probe an integrated circuit by probing the lead wire pads on the chip itself for test purposes. By way of example, during manufacture of integrated circuits, mechanical probes are used to successively probe each integrated circuit in a predetermined matrix of integrated circuits fabricated from a single silicon wafer. In other situations, such as in the fabrication of hybrid circuits and high density multi-chip interconnect (HDMI) circuits, it is also often desired to be able to probe an integrated circuit for test purposes, either to exercise and test a single integrated circuit, or possibly to temporarily interconnect to one or more other integrated circuits to test the cooperation thereof.

It is particularly desirable to be able to test semiconductors at their operating clock speed. Standard probes are too slow. Because the probes physically act as antennas, the speed of testing is very limited. Therefore the current conventional method of probing a semiconductor does not guarantee its operation at its rated or potential speed. Usually a complex semiconductor is tested at full speed only after the packaging is completed.

In the case of multichip modules, the multiplicity of chips and complexity of the circuits in a package makes it necessary to test the components separately before assembly. This is one of the main advantage over wafer scale integration, i.e. the ability to test the substrate and the chips individually before assembly therefore eliminating the need for redundant circuits in case of failure of one of the components to perform as expected.

In the near future, as production volume of multichip modules builds-up, it will be very useful, even crucial, to do the evaluation of the chips before assembling the package in a multichip module. No method, other than the diaphragm, allows the proper testing of chips because of the speed problem, but the ability to build diaphragms to test the substrate circuits may also become important because of the number of points to test in a short a time as possible. The diaphragm allows the construction of very complex structures which will avoid the current necessity of testing with flying probes and the inherent speed limitations of mechanically moving probes. Accordingly, in such instances much lower cost and specialized probing has been achieved in the past using specially fabricated diaphragms having electrical contacts and associated circuitry on one surface thereof, and supported so as to be responsive to air pressure on the opposite side thereof to encourage the contacts against the lead wire pads on an integrated circuit positioned parallel to and immediately adjacent the first surface of the diaphragm. Such test diaphragms have the advantage of potentially being low cost and potentially readily fabricatable in different forms for a variety of probing applications and circuits. In practice however, prior art fabrication techniques for fabricating such diaphragms were less then ideal, resulting in poor yield and lack of repeatability diaphragm to diaphragm.

In particular, in accordance with prior art techniques, such diaphragms are fabricated by putting the probing circuitry down on a film of suitable diaphragm material, such as mylar or the like, using conventional electroplating or sputtering deposition and photolithographic processes. At this stage of fabrication, the probe circuit could readily be made with the desired accuracy. However, the next step, specifically the mounting of the diaphragm onto a typical diaphragm support and the interconnecting of the circuit on the diaphragm to contact points on the support, is fundamentally a hand operation neither readily controlled nor repeatable in results. Accordingly, one of the purposes of the present invention is to maintain the potential advantages of test diaphragms, namely their relatively low cost and convenience, yet make the fabrication thereof an orderly process having accuracies throughout consistent with modern photolithographic processes and substantially free of the manual fabrication steps which give rise to inconsistencies and/or inaccuracies in the completed ready to use test diaphragms.

DETAILED DESCRIPTION OF THE INVENTION

The preferred embodiment of the present invention is fabricated utilizing a photosensitive glass, specifically Fotoceram manufactured by Corning Glass, as the substrate. (A similar material is also available from a Japanese manufacturer.) This material is a glass-like material with photosensitive materials therein. As a result, if one exposes the glass to ultraviolet light, typically through a mask, and develops the same by firing in the temperature range described by the manufacturer, the portion of the glass exposed to the ultraviolet light will be very soft chemically in comparison to the portion of the glass not so exposed. Thus, by dipping the exposed and developed part in dilute hydrofluoric acid (HF), the exposed portions of the part will etch away relatively rapidly, something on the order of fifty times the rate of the unexposed portions, thereby resulting in a part as defined by the mask through which the initial blank was exposed. Because of the differential etching rate between exposed and non-exposed areas and of course the ability to expose the part with collimated light, one can obtain good definition and relatively square edges on the resulting part.

Figure 1:
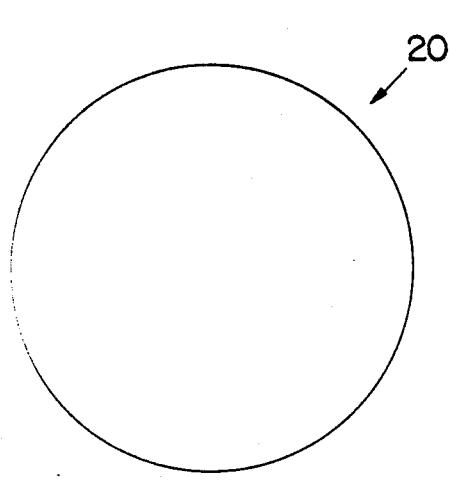
FIG. 1 is plan view of a substrate blank as may be used for fabricating electrical probe diaphragms in accordance with the present invention.
Figure 2:
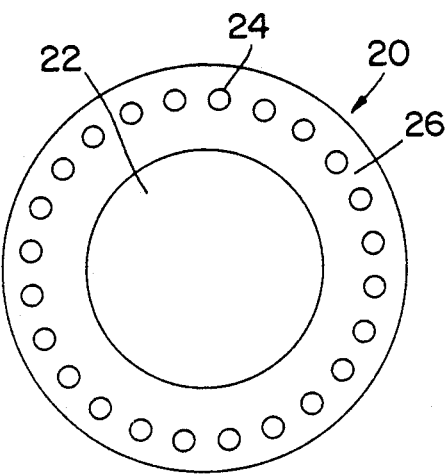
FIG. 2 is a plan view of the substrate of FIG. 1 illustrating the pattern for exposure of the substrate to ultraviolet light.
Figure 3:
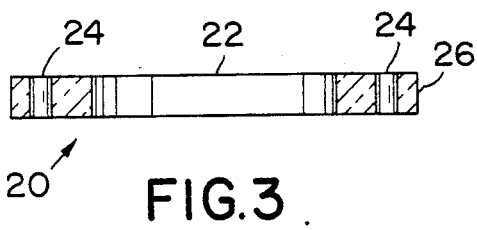
FIG. 3 is a cross-section of the substrate of FIG. 2 after firing the substrate to develop the exposed areas thereof.
Figure 4:
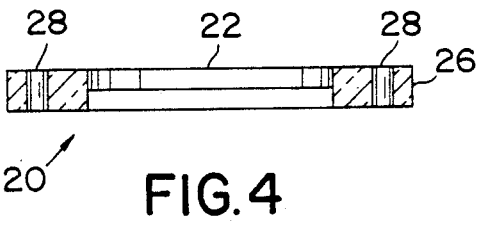
FIG. 4 is a cross-section of the substrate similar to FIG. 3, taken after the through holes 28 have been etched away, and part of the central region 22 of the substrate similarly etched away.

In the preferred embodiment of the present invention, a circular wafer 20 of the photosensitive glass is first fabricated as is shown in FIG. 1. While the size of the wafer will of course depend upon the specific application, a typical wafer may be on the order of three to five inches in diameter, and 0.025 inches thick. As the processing begins, the wafer 20 is first exposed to a collimated ultraviolet light source through a mask to expose a central region 22 thereof (see FIG. 2) and plurality of small cylindrical regions 24 in the peripheral region 26 of the blank. As shall subsequently be seen, the central region 22 will become the free area of the resulting diaphragm, with the small cylindrical regions 24 becoming plated through holes in the peripheral region to provide individual electrical contacts between the two sides of the substrate and to provide contacts with the outside world. Upon appropriate firing of the exposed blank, the exposed regions, namely the central region 22 and the through hole regions 24 in the peripheral region 26 of the blank turn dark, as shown in FIG. 3. Thereafter, the peripheral regions are etched in a aqueous hydrofluoric acid solution, preferably in the 10 to 12% concentration range, (the central area 22 being masked with wax or some other suitable etch resistant masking material) to open up the through holes 28 through the peripheral region 26 as shown in FIG. 4.

Thereafter, the substrate is remasked and fiducial reference marks 30 are etched in the top surface of the substrate, to a depth of a few microns, typically 2 microns. These marks will remain visible through the subsequent processing and provide reference marks for mask alignment purposes in that processing.

Next, the substrate is covered by sputtering on a layer of chrome, nickel, nickel-chromium or any other metal not attacked by solutions of hydrofluoric acid. (This step is only necessary when it is desired to keep the polish of the substrate intact. Due to the differential etching between exposed and un-exposed areas the protection of the surface becomes necessary only to preserve a high polish on the glass-ceramic or because the substrate is relatively very thick and requires lengthy etching times.) Thereafter, part of the layer covering the bottom central region of the substrate is removed, and the substrate is again etched, removing from the bottom or second side of the substrate all but enough of the central region 22 to provide adequate structural support for the test diaphragm to be fabricated thereover in the subsequent processing. This last step in essence substantially reduces the amount of etching which will be required later in the processing to remove all of the central region 22 of the substrate after the diaphragm has been fabricated, yet of course still maintains the planar characteristics of the top or first side of the substrate and adequate support therefor for the subsequent diaphragm and circuit support during the subsequent processing.

After the bottom central region has been etched as previously described, the nickel chromium layer on the substrate is removed and a layer of metal is sputtered on the diaphragm side of the substrate. The purpose is to provide good adhesion of the polyimide to the glass-ceramic. Depending on the exact nature of the polyimide, or other polymer, used to form the diaphragm, the adhesion between polymer and the substrate may be improved by applying a metal layer. Chrome, nickel, titanium, aluminum, titanium-tungsten are examples of suitable materials. Then, a uniform layer of uncured polyimide is applied to the first surface over the nickel chromium layer and radially outward into the peripheral region 26. The uncured layer of polyimide may be controlled in thickness as desired using conventional coating techniques, such as by spin coating of the substrate together with appropriate control of the viscocity of the uncured polyimide by control of any solvents therein. Upon curing of the polyimide, the same becomes bonded both to the peripheral region 26 and to the central region 22 over the nickel chromium layer thereon. Since it is this layer of polyimide which usually will form the principle structure of the diaphragm, the thickness thereof should be chosen to provide the strength and rigidity desired.

The next steps in the processing are directed toward the formation of the circuit over the top of the layer of polyimide. In many applications, the purpose of the circuit is to merely bring the integrated circuit bonding pad connections outward to connections on the substrate holding the diaphragm, and accordingly such a circuit may readily be fabricated without requiring any crossovers thereon. Accordingly, the formation of the circuit in the preferred embodiment proceeds by sputtering on the front side of the substrate a layer of nickel chromium approximately 2,000 Å thick, followed by a layer of titanium tungsten approximately 500 to 1,000 Å thick, and then a layer of aluminum preferably greater than 2 microns thick. These layers are then masked and etched to pattern the same to form the desired circuitry. These steps may include the appropriate metalization of the through holes 28 and local surrounding area, or alternatively the through holes may be plated in a separate operation.

After the circuitry is formed, the same is sputtered with a layer of titanium tungsten approximately 2,000 Å thick and then a layer of palladium (optional) approximately 3,000 Å thick and etched to define the bonding pad areas within the circuitry. Then approximately 2 microns of gold is electroplated over the palladium to build up the conductors. Thereafter the photo-resist is stripped and the circuitry remasked and plated with 2 to 5 microns of additional gold to form the gold bumps which will become the pressure contact points for electrical contact with the integrated circuit bonding pads. Thereafter, the photo-resist is again stripped and a thin layer of uncured polyimide is applied and cured, and thereafter etched in a pattern to expose the gold bumps. Thus, at this stage of the fabrication, the circuitry is essentially completed, the gold bumps being exposed to provide the desired contact points, with the circuit otherwise being covered with the thin polyimide layer everywhere but in the region of the plated through holes 28 in the peripheral region 26 so as to allow electrical connection thereto, as desired. Thus, to complete the fabrication process, the gold bumps are covered with a thick resist, the backside of the wafer is masked and the remainder of the central region 22 of the substrate 20 is etched away from the backside, exposing the nickel chromium layer under the polyimide diaphragm which, if desired, may now be etched away in a separate metal etch process.

In most applications it is desired to form transmission line structures to control the impedance of the electrical circuit, particularly to test high speed circuits. In this case, a layer of conductor metal is applied and shaped by photolithography over the first layer of polyimide. Typically this layer of metal may be several microns thick. A layer of polyimide is then added and cured. The purpose of this layer of polymer is to form the interlayer dielectric necessary to obtain a transmission line. Of course many variants of transmission lines are possible.

Figure 5:
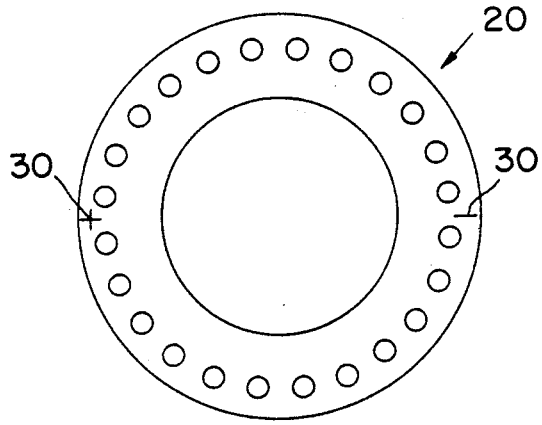
FIG. 5 is a plan view of the substrate of FIG. 4 illustrating the reference marks 30 etched therein.
Figure 6:
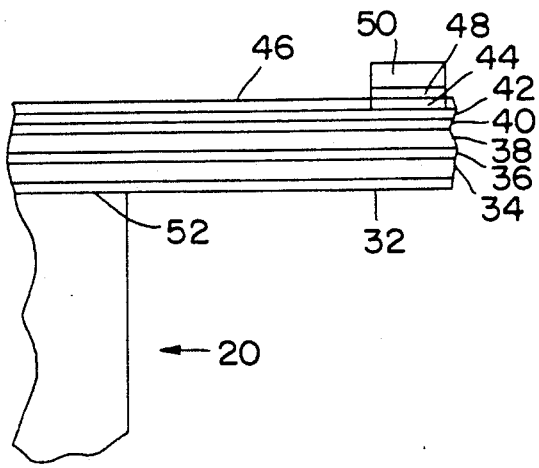
FIG. 6 is a schematic cross-section of a portion of the finished diaphragm illustrating the various layers making up a typical embodiment thereof.

Using the processing just described, a typical cross-section of a local area of the resulting diaphragm taken through one of the gold plated contact bumps 48 and an adjacent region of the substrate 20, and after removal of the initial nickel-chromium layer, may be seen in FIG. 6. This cross-section of course is not to scale, as the various metal layers as well as the polyimide layers have very different thicknesses as previously described. The cross-section is illustrative however, of the various layers making up the diaphragm and the nature of the structure thereof. In particular, at the top surface of the diaphragm structure, the gold plated bumps 50 (other materials could be used for hardness, wear resistance and other properties) which will make contact with the integrated circuit connection pads are exposed, the top of the circuit otherwise being covered with a thin polyimide layer 46. Therebetween are the various metal layers making up the circuit, namely a titanium tungsten layer 32, an aluminum layer 34, another titanium tungsten layer 36 (optional), a polyimide layer 38, another titanium tungsten layer 40, an aluminum layer 42, a further titanium tungsten layer 44, a palladium layer 48 (optional) and of course then the gold layer 50. Obviously, in each of the masking steps defining the patterned layers, the mask is accurately aligned with respect to the alignment marks 30 on the substrate 20 (see FIG. 5), so that all such layers are very accurately aligned not only relative to each other, but relative to the substrate itself. Similarly, the polyimide layer 38 is self-supporting in the flexing region, neither being stressed nor loose or wrinkled in any way, but instead exactly conforming to the substrate support to provide a durable structure for the purpose, and of course sealed with respect thereto.

In certain instances it may be necessary or desirable to have one or more cross-overs in the circuit formed on the polyimide diaphragm. For this purpose, one can readily form multiple patterned metal layers on the diaphragm separated from each other by additional polyimide layers by merely putting down a polyimide layer over the first patterned metal layer, forming another patterned metal layer thereover, etc., as required, opening up the various layers as required near the end of the processing so as to form and connect the contact bumps as desired. Thus, while the preferred embodiment of the present invention have been disclosed and described in detail herein, it will be understood by those skilled in the art that various changes in form and detail may be made therein without departing from the spirit and scope of the invention.

I claim:

1. A method of making a test diaphragm and support for electrical probing of circuits such as integrated circuits comprising the steps of:
   (a) providing a substrate having first and second sides, and having a central region and an integral peripheral region, the central region having the area of the desired diaphragm, whereby the peripheral region of the substrate will circumscribe the desired diaphragm to be formed in the central region thereof;
   (b) forming over the first side of the substrate:
      (i) at least one layer of polymer by putting a film of uncured polymer on the first side of the substrate over the central region and at least part of the peripheral region thereof and curing the same so that the layer of polymer is at least bonded to the peripheral region of the first side of the substrate, and;
      (ii) at least one patterned metalization layer over the central region of the substrate;
   (c) removing the central region of the substrate, whereby the layer of polymer and the patterned metalization layer form the desired test diaphragm integrally supported by the remaining peripheral region of the substrate.

2. The method of claim 1 wherein in step (b)(i), the layer of polymer is bonded to both the central region and the peripheral region of the first side of the substrate.

3. The method of claim 1 wherein the substrate provided in step (a) has a reduced resistance to the removal of all the substrate material in the central region thereof in comparison to the resistance to substrate material removal in the peripheral region thereof.

4. The method of claim 3 wherein the central region of the substrate provided in step (a) has a reduced thickness in the central region thereof, which reduced thickness provides at least part of the reduced resistance to substrate material removal in the central region.

5. The method of claim 1 wherein in step (c), the central region of the substrate is removed by etching.

6. The method of claim 1 wherein the at least one patterned metalization layer extends outward into the peripheral region of the substrate.

7. The method of claim 6 further including electrical contact means located in the peripheral region of the substrate and electrically connected to the patterned metalization layer.

8. The method of claim 7 wherein the electrical contact means is accessible from the second side of the substrate, whereby electrical contact may be made with the test diaphragm from the second side of the substrate.

9. The method of claim 7 wherein the electrical contact means includes plated through holes in the peripheral region of the substrate, whereby electrical contact may be made with the test diaphragm from the second side of the substrate.

10. The method of claim 1 wherein in step (b)(ii), multiple overlying patterned metalization layers electrically separated from each other in substantial part by intervening layers of polymer are formed, thereby forming electrical crossovers in the circuit on the test diaphragm.

11. The method of claim 1 wherein the substrate provided in step (a) is an exposed and developed photosensitive glass, whereby the central region of the substrate will etch at a much higher rate than the peripheral region thereof, and wherein in step (c), the central region of the substrate is removed by etching.

12. A method of making a test diaphragm and support for electrical probing of circuits such as integrated circuits comprising the steps of:
   (a) providing a substrate having first and second sides, and having a central region and an integral peripheral region, the central region having the area of the desired diaphragm, whereby the peripheral region of the substrate will circumscribe the desired diaphragm to be formed in the central region thereof;
   (b) forming over the first side of the substrate:
      (i) at least one layer of polymer by putting a film of uncured polymer on the first side of the substrate over the central region and at least part of the peripheral region thereof and curing the same so that the layer of polymer is at least bonded to the peripheral region of the first side of the substrate, and;

(ii) at least one patterned metalization layer over the central region and extending outward onto the peripheral region of the substrate;

(c) etching away the central region of the substrate, whereby the layer of polymer and the patterned metalization layer form the desired test diaphragm integrally supported by the remaining peripheral region of the substrate.

13. The method of claim 12 wherein step (b)(i), the layer of polymer is bonded to both the central region and the peripheral region of the first side of the substrate.

14. The method of claim 12 wherein the substrate provided in step (a) has a reduced resistance to the removal of all the substrate material in the central region thereof in comparison to the resistance to substrate material removal in the peripheral region thereof.

15. The method of claim 14 wherein the central region of the substrate provided in step (a) has a reduced thickness in the central region thereof, which reduced thickness provides at least part of the reduced resistance to substrate material removal in the central region.

16. The method of claim 12 further including electrical contact means located in the peripheral region of the substrate and electrically connected to the patterned metalization layer.

17. The method of claim 16 wherein the electrical contact means is accessible from the second side of the substrate, whereby electrical contact may be made with the test diaphragm from the second side of the substrate.

18. The method of claim 16 wherein the electrical contact means includes plated through holes in the peripheral region of the substrate, whereby electrical contact may be made with the test diaphragm from the second side of the substrate.

19. The method of claim 12 wherein in step (b)(ii), multiple overlying patterned metalization layers electrically separated from each other in substantial part by intervening layers of polymer are formed, thereby forming electrical crossovers in the circuit on the test diaphragm.

20. The method of claim 12 wherein the substrate provided in step (a) is an exposed and developed photosensitive glass, whereby the central region of the substrate will etch at a much higher rate than the peripheral region thereof.

21. A method of making a test diaphragm and support for electrical probing of circuits such as integrated circuits comprising the steps of:

(a) providing a substrate having first and second sides, and having a central region and an integral peripheral region, the central region having the area of the desired diaphragm, whereby the peripheral region of the substrate will circumscribe the desired diaphragm to be formed in the central region thereof, the substrate being an exposed and developed photosensitive glass whereby the central region of the substrate will etch at a much higher rate than the peripheral region thereof;

(b) forming over the first side of the substrate:

(i) at least one layer of polymer by putting a film of uncured polymer on the first side of the substrate over the central region and at least part of the peripheral region thereof and curing the same so that the layer of polymer is at least bonded to the peripheral region of the first side of the substrate, and;

(ii) at least one patterned metalization layer over the central region and extending outward onto the peripheral region of the substrate;

(c) etching away the central region of the substrate, whereby the layer of polymer and the patterned metalization layer form the desired test diaphragm integrally supported by the remaining peripheral region of the substrate.

22. The method of claim 21 wherein in step (b)(i), the layer of polymer is bonded to both the central region and the peripheral region of the first side of the substrate.

23. The method of claim 21 wherein the central region of the substrate provided in step (a) has a reduced thickness in the central region thereof.

24. The method of claim 21 further including electrical contact means located in the peripheral region of the substrate and electrically connected to the patterned metalization layer.

25. The method of claim 24 wherein the electrical contact means is accessible from the second side of the substrate, whereby electrical contact may be made with the test diaphragm from the second side of the substrate.

26. The method of claim 24 wherein the electrical contact means includes plated through holes in the peripheral region of the substrate, whereby electrical contact may be made with the test diaphragm from the second side of the substrate.

27. The method of claim 21 wherein in step (b)(ii), multiple overlying patterned metalization layers electrically separated from each other in substantial part by intervening layers of polymer are formed, thereby forming electrical crossovers in the circuit on the test diaphragm.

28. The method of claim 21 wherein the substrate provided in step (a) is an exposed and developed photosensitive glass, whereby the central region of the substrate will etch at a much higher rate than the peripheral region thereof.

* * * * *